(12) United States Patent
Dzwonczyk

(10) Patent No.: US 6,168,454 B1
(45) Date of Patent: Jan. 2, 2001

(54) REMOVABLE PIN STABILIZER AND ASSEMBLY

(75) Inventor: Luke Dzwonczyk, Lompoc, CA (US)

(73) Assignee: The United States of America as represented by the Secretary of the Navy, Washington, DC (US)

(*) Notice: Under 35 U.S.C. 154(b), the term of this patent shall be extended for 0 days.

(21) Appl. No.: 09/439,463

(22) Filed: Nov. 10, 1999

(51) Int. Cl.[7] .................................................. H01R 13/64
(52) U.S. Cl. .......................... 439/381; 439/892; 439/374; 439/149
(58) Field of Search ........................... 439/374, 892, 439/149, 70, 73, 381

(56) References Cited

U.S. PATENT DOCUMENTS

| 4,394,795 | * | 7/1983 | Goss ....................................... 439/943 |
| 4,655,516 | * | 4/1987 | Shaffer et al. ......................... 439/374 |
| 4,776,804 | * | 10/1988 | Johnson et al. ........................ 439/62 |
| 4,872,845 | * | 10/1989 | Korsunsky et al. .................... 439/70 |
| 5,090,927 | * | 2/1992 | McAnany ............................... 439/149 |
| 5,348,488 | | 9/1994 | Green ..................................... 439/140 |

* cited by examiner

Primary Examiner—Gary F. Paumen
Assistant Examiner—Tho D. Ta
(74) Attorney, Agent, or Firm—Darrell E. Hollis; John Tarlano

(57) ABSTRACT

A removable pin stabilizer for stabilizing carrier pins of an integrated circuit chip carrier before and during placement of the pins into sockets of a circuit board. The removable pin stabilizer includes a non-dissolvable plate, the non-dissolvable plate having parallel dissolvable sections traversing the plate, the parallel dissolvable sections being through the plate and having holes through the plate for receiving the carrier pins, the holes encompassing the parallel dissolvable sections, wherein the parallel dissolvable sections can be dissolved by a solvent after the chip carrier is mounted and positioned correctly to the circuit board. The resultant additional space created by such removal will allow an increased flow of air between the integrated circuit chip carrier and the circuit board.

9 Claims, 3 Drawing Sheets

REMOVABLE PIN STABILIZER AND ASSEMBLY

BACKGROUND OF THE INVENTION

U.S. Pat. No. 5,348,488 shows an organizer The organizer has holes that accommodate large pins. The large pins are inserted into a motherboard. The organizer cannot be removed from around the large pins, after the large pins have been inserted into the mother board.

An integrated circuit chip carrier could be designed to have slender pins. Such a chip carrier could hold an integrated circuit chip. The slender pins of the chip carrier could have a diameter of from 0.006 inches to 0.010 inches. Such a chip carrier could be electrically connected to a circuit board.

The advantage of using a chip carrier that has slender pins, is that when the slender pins are heated or cooled, the slender pins will exert less force between the chip carrier and the circuit board than would thicker and shorter pins. Also, the slender pins would undergo less bending stress.

A removable pin stabilizer, for stabilizing slender pins, is disclosed. Such a removable pin stabilizer could stabilize slender pins of an integrated circuit chip carrier. A removable pin stabilizer would have holes that are of a size needed to guide and protect the slender pins from being bent before and during placement of the pins into sockets of a circuit board. For holding slender pins having a diameter from 0.006 inches to 0.010 inches, the diameter of the holes might be 0.001 inches larger, in diameter.

Again, holes in a removable pin stabilizer have a proper size to guide and protect slender pins of the integrated circuit chip carrier, as the slender pins are placed into sockets of a circuit board. The holes would have a diameter from 0.007 inches to 0.011 inches, to respectively accept slender pins having a diameter of from 0.006 to 0.010 inches.

The slender pins of an integrated circuit chip carrier would not easily bend during mounting of the slender pins into sockets of a circuit board, due to the pin stabilizer.

A removable pin stabilizer, for stabilizing slender pins, is contemplated, and is herein disclosed.

A removable pin stabilizer will stabilize and protect slender pins of the integrated circuit chip carrier, before and as slender pins of the chip carrier are mounted into sockets of a circuit board. The removable pin stabilizer would be removed after mounting of the slender pins of a chip carrier into sockets of a circuit board. After mounting, the removable pin stabilizer would be removed from around the slender pins. An increased amount of cooling air might circulate between the chip carrier and the circuit board, due to removal of the removable pin stabilizer from a position between the mounted chip carrier and the circuit board, to better cool the chip carrier and a chip on the chip carrier. After removal, a comparatively large opening would permit the free flow of air or permit application of cleansing agents, and would aid visual inspection.

Again, a removable pin stabilizer would protect slender pins of a chip carrier, the slender pins otherwise being easily bent prior to mounting, or during mounting, of a chip carrier onto sockets of a circuit board. Such slender pins might have a small diameter, such as a diameter from 0.006 inches to 0.010 inches. Such slender pins could be easily bent during mounting of the chip carrier into sockets of a circuit board were it not for use of a removable pin stabilizer. The removable pin stabilizer could be removed to allow the carrier and an integrated circuit chip that the carrier carries, to be air cooled by an increased amount.

A removable pin stabilizer assembly is disclosed. Such a removable pin stabilizer could include a chip carrier, an integrated circuit chip on the chip carrier, a package lid over the integrated circuit chip, a removable pin stabilizer around slender pins of the chip carrier, and a circuit board into sockets of which the slender pins have been placed. The removable pin stabilizer is first placed around slender pins of an integrated circuit chip carrier, near the free ends of the pins. After the slender pins of the integrated circuit chip carrier have been pushed into electrical sockets of the circuit board, to complete the electrical connection of the chip carrier, the chip carrier stands off of the circuit board and the removable pin stabilizer is removed. Additional space is created between the chip carrier and the circuit board by removal of the pin stabilizer from around the pins. More air will circulate due to this increased space. The greater air flow will better cool the chip and chip carrier.

A removable pin stabilizer would initially be located around slender pins of an integrated circuit chip carrier, near the ends of the slender pins. The stabilizer could be made in a thick version with conical holes to direct ends of severely distorted pins into alignment. As the slender pins are pushed into the electrical sockets of the circuit board, the removable pin stabilizer retreats or recedes to a position just below the chip carrier of the pin stabilizer assembly. As the pins are pushed into the sockets the pin stabilizer comes in contact with the circuit board that is below the pin stabilizer.

All or part of the removable pin stabilizer can be made from a dissolvable or meltable material. The entire removable pin stabilizer, or a portion that is the width of the holes, for example, and forms a channel connecting the holes, can be dissolved in a solvent or melted after the chip carrier is mounted and positioned correctly to the circuit board. The resultant additional space created by such removal will allow an increased flow of air between the integrated circuit chip carrier and the circuit board. This flowing air cools the integrated circuit chip carrier.

SUMMARY OF THE INVENTION

A removable pin stabilizer, comprising a non-dissolvable plate, the non-dissolvable plate having parallel dissolvable sections traversing the plate, the parallel dissolvable sections being through the plate, holes through the plate, the holes encompassing the parallel dissolvable sections.

DESCRIPTION OF THE PREFERRED EMBODIMENT

Figure 1A:
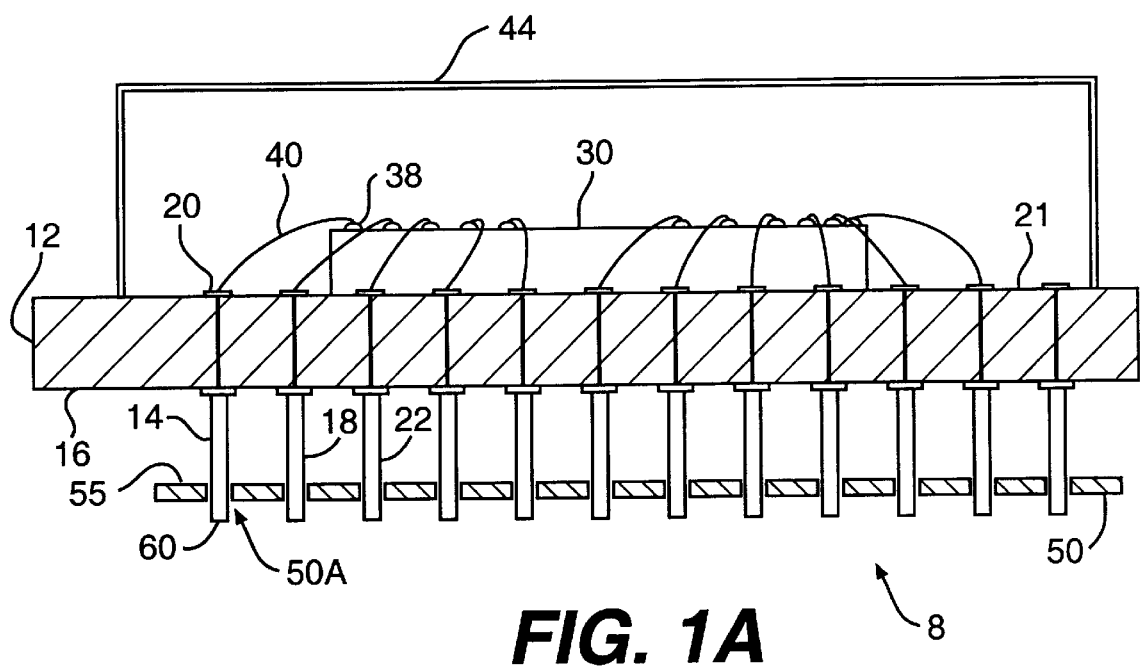
FIG. 1A is a side sectional view of an assembly of a chip, chip carrier and removable pin stabilizer, the removable pin stabilizer being around slender pins of the chip carrier.

FIG. 1A shows an assembly 8 of an integrated circuit chip carrier 12, an integrated circuit chip 30 on chip carrier 12, package lid 44 over chip 30 and a removable pin stabilizer 50 around slender pins of chip carrier 12. The integrated circuit chip carrier 12 has several slender carrier pins, including slender carrier pins 14, 18 and 22. The slender carrier pins are attached to the chip carrier 12 at the lower surface 16 of chip carrier 12. Again, one such slender carrier pin is slender carrier pin 14. The slender carrier pin 14 passes through hole 50A of removable pin stabilizer 50. End 60 of slender carrier pin 14 passes through hole 50A in nonconductive pin stabilizer 50.

In FIG. 1A, the slender carrier pins of chip carrier 12 are electrically connected, through chip carrier 12, to carrier pads that are located on the upper surface 21 of chip carrier 12. Slender carrier pin 14 is electrically connected to carrier pad 20.

Each of the slender carrier pins of chip carrier 12 has a diameter of 0.010 inches. The length of each of the carrier pins is 0.150 inches. The diameter of each of the carrier pins could be chosen to be less than 0.010 inches, that is, in a range from 0.006 inches to 0.010 inches. The length of each of the slender carrier pins could be chosen to be less or more than 0.150 inches.

Figure 1B:
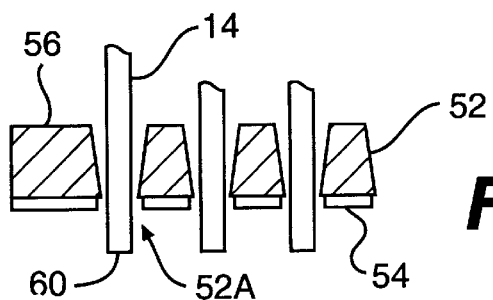
FIG. 1B is a side view of an alternate removable pin stabilizer, the removable pin stabilizer having conical shaped holes, slender pins of a chip carrier being in the conical shaped holes.
Figure 1C:
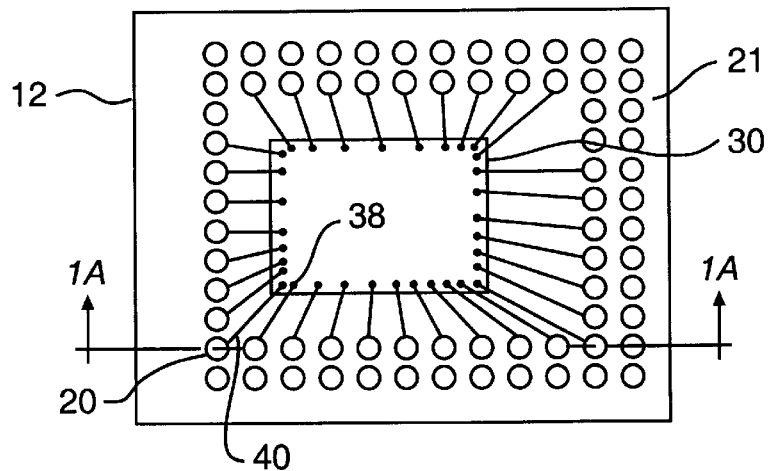
FIG. 1C is a top view of an assembly of a chip carrier and chip.

In FIG. 1C, carrier pads, including carrier pad 20, are shown on the upper surface 21 of carrier 12. Semiconductor integrated circuit chip 30 is bonded to the upper surface 21 of chip carrier 12, as shown in FIG. 1C. The chip 30 is located on chip carrier 12 within both a first inner rectangular array of carrier pads and a second outer rectangular array of carrier pads of carrier 12. There is a slender carrier pin associated with each carrier pad.

A chip pad 38 of chip 30 are electrically connected to carrier pad 20 by means of gold bonding wire 40, as shown in FIGS. 1A and 1C. Gold bonding wires are shown in FIGS. 1A and 1C as being attached between chip pads of chip 30 and carrier pads, including carrier pad 20, of chip carrier 12. A package lid 44 covers and protects chip 30 and the bonding wires. The package lid 44 is attached to chip carrier 12.

Figure 2:
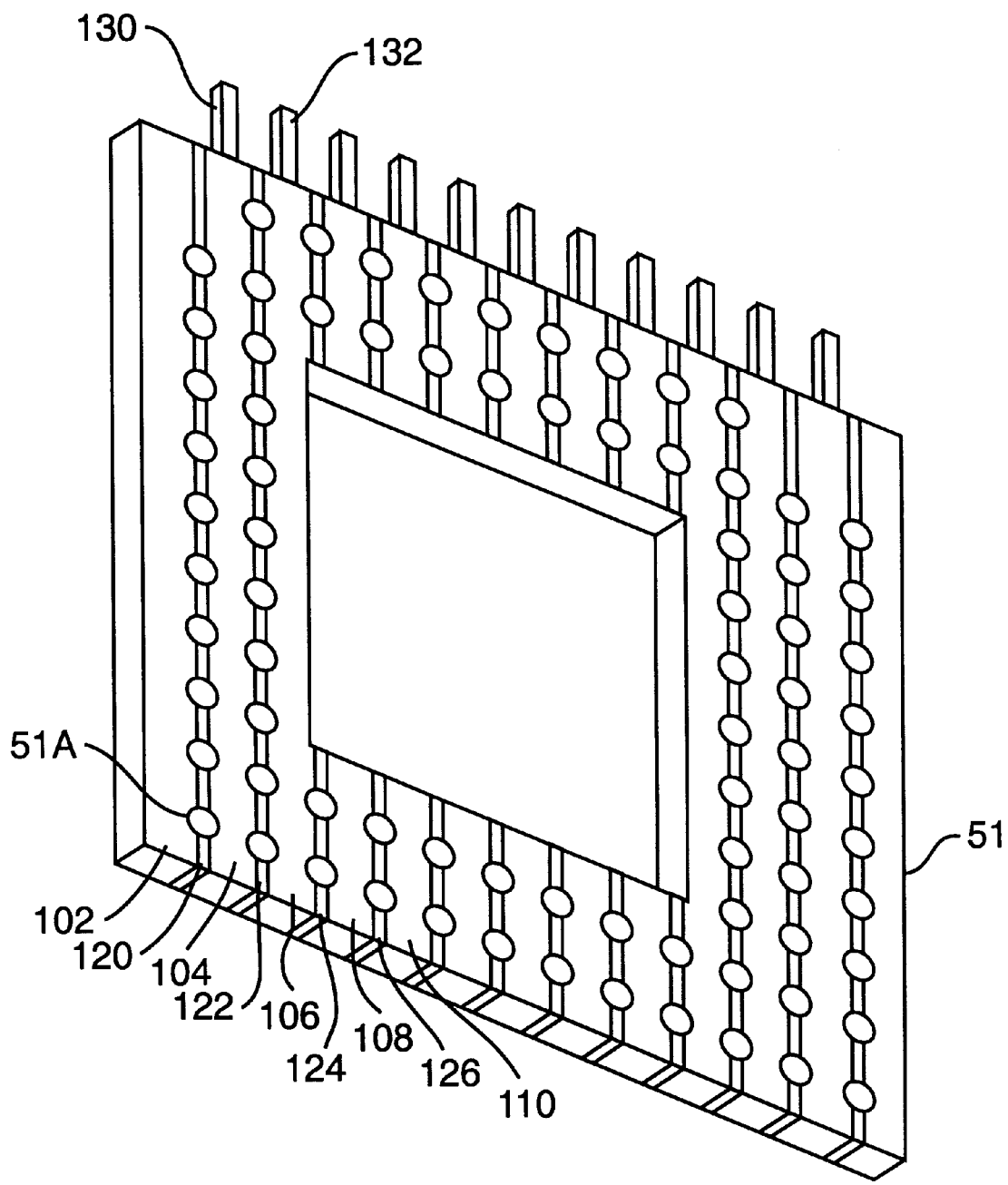
FIG. 2 is a perspective view of a removable pin stabilizer.

A removable pin stabilizer 50 is shown in FIG. 1A. A removable nonconductive pin stabilizer 51 is shown in FIG. 2. The removable pin stabilizers 50 and 51 each has a shape of a rectangular plate. Removable pin stabilizers 50 and 51 can be identical in construction, The removable pin stabilizer 50, or the removable nonconductive pin stabilizer 51, can stabilize slender carrier pins of chip carrier 12. The pin stabilizer 50 or the pin stabilizer 51 can hold the slender carrier pins of chip carrier 12 in alignment. The pin stabilizers 50 and 51 each has a thickness of 0.015 inches. The pin stabilizers 50 and 51 can have a thickness greater than 0.015 inches. The pin stabilizers 50 and 51 each has a shape of a thin rectangular plate.

The removable pin stabilizer 50 has cylindrically shaped holes, including hole 50A, through the pin stabilizer 50, as shown in FIG. 1A. The removable pin stabilizer 51 of FIG. 2 has cylindrically shaped holes, including hole 51A through the pin stabilizer 51, as shown in FIG. 2.

In FIG. 2, dissolvable sections 120, 122, 124 and 126 of removable pin stabilizer 51 are shown. Cylindrical holes are aligned with the dissolvable sections of pin stabilizer 51.

The diameter of each of the cylindrically shaped holes in pin stabilizers 50 and 51 is 0.011 inches. The diameter of the holes are designed to hold the 0.010 inch diameter pins. There is a 0.001 inch difference between the diameters of the pins and the diameters of the holes. This 0.001 difference would also apply to other diameters of holes of removable pin stabilizers that are designed to receive slender carrier pins that have other diameters.

A cylindrical hole 50A is shown in pin stabilizer 50, in FIG. 1A. The cylindrical hole 50A extends through the removable pin stabilizer 50. In FIG. 1A, the cylindrical holes are perpendicular to lower surface 54A, and perpendicular to upper surface 56A of the pin stabilizer 50. Stabilizer 50 has a cylindrical hole 50A to receive slender cylindrical carrier pin 14 of chip carrier 12, as shown in FIG. 1A.

The cylindrical holes in removable pin stabilizer 50 of FIG. 1A, and removable pin stabilizer 51 of FIG. 2, have a diameter of 0.011 inches. Slender 0.010 diameter cylindrical carrier pins passes through the 0.011 diameter cylindrical holes of removable pin stabilizer 50, as shown in FIG. 1A. Removable pin stabilizer 50, and removable pin stabilizer 51, are slipped over the ends of slender carrier pins. The end 60 of pin 14 passes through cylindrical hole 50A. The removable pin stabilizer 50 is held by friction onto the slender carrier pins, including carrier pin 14. The pin stabilizer 50 is held in a position such that the upper surface 55 of removable pin stabilizer 50 is located near the ends of the pins. The upper surface 55 of removable pin stabilizer 50 is approximately 0.030 inches from the ends of the carrier pins.

A removable pin stabilizer, such as removable pin stabilizers 50 and 51, may be made from only, or mainly, a dissolvable or meltable material. A removable pin stabilizer may alternatively be made from two different materials. One material being dissolvable or meltable, and the remaining material not being dissolvable or meltable. A removable pin stabilizer may alternately be made of more than two material, at least one material of which is dissolvable or meltable. The dissolvable or meltable material could be of a type that can be removed from around carrier pins. The removal of a removable pin stabilizer could be accomplished such as by melting or dissolving the material of the removable pin stabilizer. In addition, various materials such as solder preforms, fluxes and solvents may be incorporated into or on the surfaces of a removable pin stabilizer.

FIG. 2 shows a removable pin stabilizer 51. Removable pin stabilizer 51 is made from a combination of non-dissolvable sections and dissolvable sections. Non-dissolvable sections, including non-dissolvable sections 102, 104, 106, 108 and 110, of removable pin stabilizer 51 are shown in FIG. 2. FIG. 2 also shows dissolvable sections, including dissolvable sections 120, 122, 124 and 126, of removable pin stabilizer 51. Cylindrical holes are in the dissolvable sections. The cylindrical holes have a diameter of 0.011 inches. That diameter is greater than the width of each of the dissolvable sections. Dissolvable section 120 joins together non-dissolvable sections 102 and 104. Dissolvable section 122 joins together non-dissolvable sections 104 and 106. Dissolvable section 124 joins together non-dissolvable sections 106 and 108. Dissolvable section 126 joins together non-dissolvable sections 108 and 110.

In FIG. 2 holes are shown along the dissolvable sections of removable pin stabilizer 51. The cylindrical hole 51A, for instance, is shown as being placed in the dissolvable section 120. Many holes are formed into a column of holes along dissolvable section 120. Many other holes are formed into columns, each column being along a dissolvable section of removable pin stabilizer 51. The holes, such as hole 51A, are cylindrical holes, for receiving carrier pins of a chip carrier 12. There are as many dissolvable sections in removable pin stabilizer 51A, as there are columns of pins in chip carrier 12.

Non-dissolvable sections of removable pin stabilizer 51 can be made from a material such as a high melting point non-dissolvable plastic. The dissolvable sections of removable pin stabilizer 51 can be made from a dissolvable material such as a wax material. Such a wax material could be a paraffin.

The dissolvable sections of removable pin stabilizer 51 can be removed from non-dissolvable sections of removable pin stabilizer 51, and thusly from around the pins of a chip carrier 12, by dissolving the dissolvable sections by means of a solvent. The dissolvable sections could be composed of a dissolvable wax-type material. Such a dissolvable wax material could be a paraffin. This dissolvable material is nonconductive and is dissolvable by means of a solvent. A solvent for a such a wax material is known in the art. Such a solvent for a wax material is one of a group comprised of toluene, methanol, MEK or MTBE.

Alternately, the non-dissolvable sections of removable pin stabilizer 51 could be joined together by dissolvable adhesive sections. The dissolvable adhesive sections of removable pin stabilizer 51 would be made to loss their adhesive quality on contact with a fluid such as alcohol. Such an adhesive could be a glue.

Figure 3:
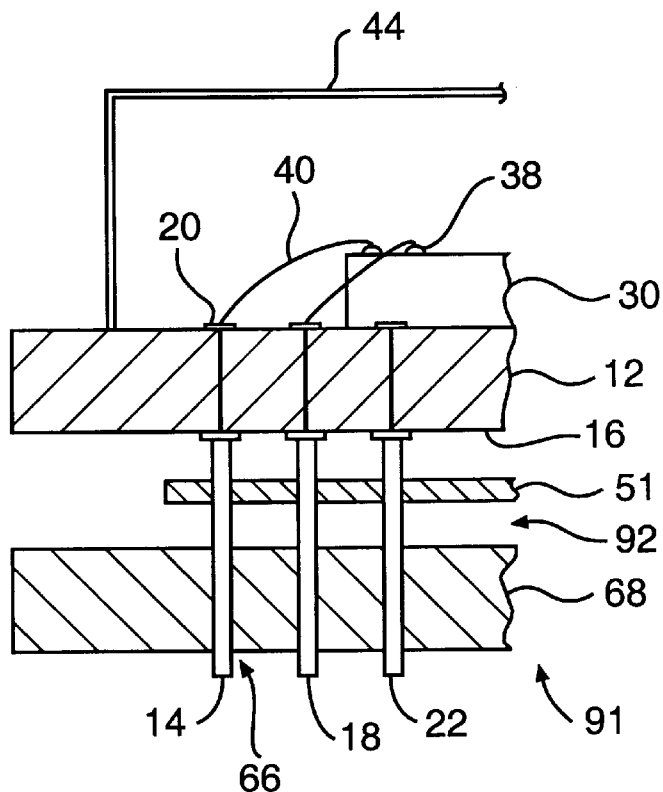
FIG. 3 is a side sectional view of an end portion of an assembly of a chip, chip carrier, removable pin stabilizer and circuit board, the removable pin stabilizer not yet having been removed from between the chip carrier and the circuit board.

Such a nonconductive pin stabilizer 50 or removable nonconductive pin stabilizer 51 would be mounted around the carrier pins of carrier 12. The pins of carrier 12 can then be mounted into electrical sockets of a circuit board 68, as shown in FIG. 3. Pin 14 is mounted in electrical socket 66 of circuit board 68.

Meltable sections could alternately be used in place of dissolvable sections in removable pin stabilizer 51. The meltable sections could be made from a wax material. Such a wax material could be a paraffin. Such a paraffin could ideally have a melting point that is between 60 degrees Centigrade and 80 degrees Centigrade. However, a melting point, of meltable sections of a removable pin stabilizer, that is less than 100 Degrees Centigrade, would not damage integrated circuit chip 30.

The nonconductive removable pin stabilizer 51 could be processed such as by use of heat or a solvent, to melt meltable, or dissolvable sections, and to allow the non-meltable, or non-dissolvable sections to separate from one another.

The removable pin stabilizer 51 of FIG. 2 has nonconductive dissolvable sections and nonconductive non-dissolvable sections. The removable pin stabilizer 51 of FIG. 2 could have nonconductive meltable sections and nonconductive non-meltable sections.

The separated non-dissolvable sections could be removed from between the carrier and the circuit board by pulling on tabs that are connected to the non-dissolvable sections. A tab 130 is connected to non-dissolvable section 102 of removable chip carrier 51. A tab 132 is connected to non-dissolvable section 104, as shown in FIG. 2.

As shown in FIG. 3, the removable pin stabilizer 51 aligns the pins and prevents them from being bent prior to and during placement of the pins into electrical sockets, such as electrical socket 66, in circuit board 68. During placement of the pins of chip carrier 12 into the circuit board 68, the pin stabilizer 51 can be separately pushed upward toward the lower surface 16 of the chip carrier 12, as chip carrier 12 is pushed toward circuit board 68. This dual action will cause the slender pins to remain aligned and not bent during placement in the circuit board.

As shown in FIG. 3, after placement of the pins in the circuit board, the lower surface 16 of chip carrier 12 has been pulled away from circuit board 68 by a distance of, for example, 0.060 inches. A space 92 is produced between the chip carrier 12 and the circuit board 68 prior to removal of removable pin stabilizer 51.

FIG. 3 shows the chip carrier 12, the removable pin stabilizer 51, and the circuit board 68 joined together. The removable pin stabilizer 51 separates the pins from one another. The removable pin stabilizer 51 of FIG. 3 also acts as a guide for the pins, as the slender pins are pushed into the electrical sockets, such as electrical socket 66, of circuit board 68.

Figure 4:
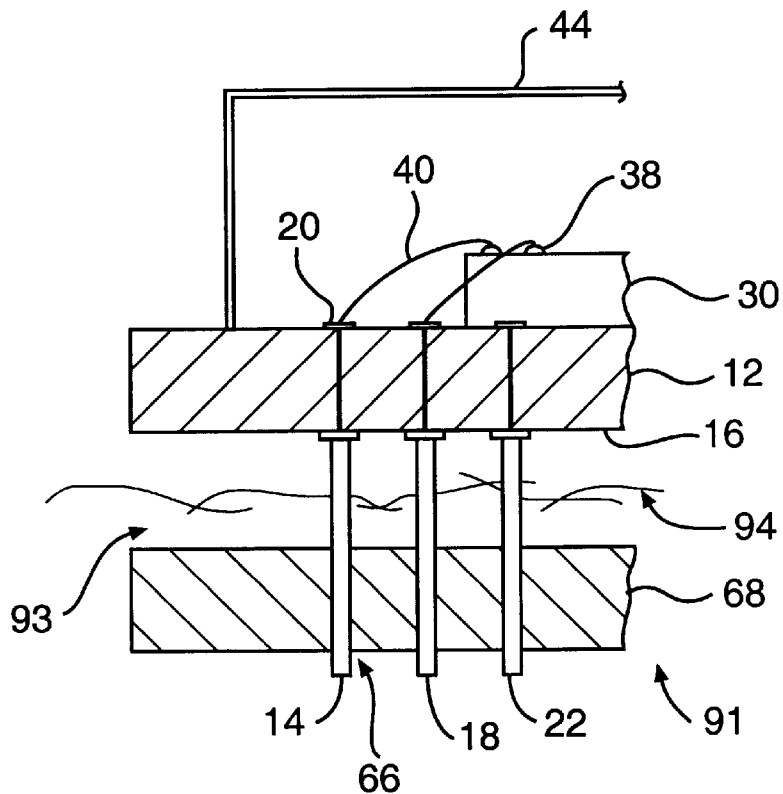
FIG. 4 is a side sectional view of an end portion of assembly of a chip, chip carrier and circuit board, the removable pin stabilizer having been removed from between the chip carrier and the circuit board.

FIG. 4 shows that the removable pin stabilizer 51 has been removed from a region that is between carrier 12 and the circuit board 68. As a result, there is an enlarged air space 93 between the chip carrier 12 and the circuit board 68. This enlarged air space 93 will allow cooling air 94 to flow between carrier 12 and circuit board 68. The cooling air 94 will cool chip carrier 12 and chip 30. The integrated circuit chip 30 will be less likely to overheat due to the flow of the cooling air 94 between carrier 12 and circuit board 68.

Again, all or part of a removable pin stabilizer can be made of a dissolvable or meltable material. A completely meltable removable pin stabilizer could be removed by heating a carrier-pin stabilizer-circuit board assembly, such as an assembly 91 shown in FIG. 3, until the meltable material flows away from the region between a chip carrier and a circuit board. A totally wax type removable pin stabilizer could thus be removed from around pins of a carrier, by heating the wax material in order to melt the wax material. Such a wax could be a paraffin. Such a paraffin could have a melting point between 60 degrees Centigrade and 80 degrees Centigrade. However a melting point, of a completely meltable removable pin stabilizer, that is less than 100 degrees Centigrade, would not damage integrated circuit chip 30.

In FIG. 1B, an alternate embodiment of a removable pin stabilizer, that is removable pin stabilizer 52, is shown. Removable pin stabilizer 52 has conical shaped holes, that is cone shaped, holes, through the removable pin stabilizer 52. A conical shaped hole 52A of pin stabilizer 52 is shown in FIG. 1B. Conical shaped holes extend through the pin stabilizer 52. In FIG. 1B, the conical shaped holes each make an acute angle with lower surface 54A, and each make an obtuse angle with upper surface 56B of the removable pin stabilizer 52. Removable pin stabilizer 52 has cone shape holes therein, such as hole 52A, to more easily receive and guide cylindrical carrier pins of a carrier 12, than will the cylindrical holes of stabilizer 52.

The alternate arrangement is shown in FIG. 1B, wherein the removable pin stabilizer 52 is 0.050 inches thick and the holes are cone shaped. The greater thickness of removable pin stabilizer 52 permits the alignment of severely distorted pin ends, as the greater diameter entrance of the cone shaped holes guide the ends of the carrier pins. In this case, it may be unnecessary to pull away the carrier 12, as it is positioned by resting in the stabilizer 52. Pin 14 is shown in conical hole 52A of pin stabilizer 52.

While the present invention has been disclosed in connection with the preferred embodiment thereof, it should be understood that there may be other embodiments which fall within the spirit and scope of the invention as defined by the following claims.

What is claimed is:

1. A removable pin stabilizer for stabilizing carrier pins of a chip carrier before and during placement of the pins into sockets of a circuit board, comprising a non-dissolvable plate, the non-dissolvable plate having parallel dissolvable sections traversing the plate, the parallel dissolvable sections being through the plate and having holes through the plate for receiving the carrier pins, the holes encompassing the parallel dissolvable sections, wherein the parallel dissolvable sections can be dissolved by a solvent after the chip carrier is mounted and positioned correctly to the circuit board.

2. The removable pin stabilizer of claim 1 wherein the holes are conical shaped holes.

3. The removable pin stabilizer of claim 1, the dissolvable sections of the removable pin stabilizer comprising a wax material.

4. A removable pin stabilizer for stabilizing carrier pins of a chip carrier before and during placement of the pins into sockets of a circuit board, comprising a non-meltable plate, the non-meltable plate having parallel meltable sections traversing the plate, the parallel meltable sections being through the plate and having holes through the plate for receiving the carrier pins, the holes encompassing the parallel meltable sections, wherein the parallel meltable sections can be melted by a heating means after the chip carrier is mounted and positioned correctly to the circuit board.

5. The removable pin stabilizer of claim 4, wherein the meltable sections are wax sections that melt at a temperature less than 100 degrees Centigrade.

6. The removable pin stabilizer of claim 4 wherein the holes are conical shaped holes.

7. The removable pin stabilizer of claim 4, the dissolvable sections of the removable pin stabilizer comprising a wax material.

8. A pin stabilizer assembly, comprising:

(a) an integrated circuit chip carrier having slender pins extending from a first side of the integrated circuit chip carrier; and (b) a removable pin stabilizer, comprising a non-dissolvable plate, the non-dissolvable plate having parallel dissolvable sections traversing the plate, the parallel dissolvable sections being through the plate and having holes through the plate, the holes encompassing the parallel dissolvable sections in the shape of a plate, the slender pins extending through the holes, wherein the parallel dissolvable sections can be dissolved by a solvent after the chip carrier is mounted and positioned correctly to the circuit board.

9. A removable pin stabilizer assembly, comprising:

(a) an integrated circuit chip carrier having slender pins extending from a first side of the integrated circuit chip carrier;

(b) a semiconductor chip on a second side of the integrated circuit chip carrier, the semiconductor chip being electrically connected to the slender pins;

(c) a package lid over the semiconductor chip, the package lid connected to the integrated circuit chip carrier;

(d) a removable pin stabilizer, comprising a non-dissolvable plate, the non-dissolvable plate having parallel dissolvable sections traversing the plate, the parallel dissolvable sections being through the plate and having holes through the plate, the holes encompassing the parallel dissolvable sections in the shape of a plate, the slender pins extending through the holes; and (e) a circuit board, an end of each slender pin passing into a socket in the circuit board, each slender pin making electrical contact with a socket of the circuit board, wherein the parallel dissolvable sections can be dissolved by a solvent after the chip carrier is mounted and positioned correctly to the circuit board.

* * * * *